(12) United States Patent
Lam

(10) Patent No.: US 6,658,115 B1
(45) Date of Patent: * Dec. 2, 2003

(54) METHOD AND APPARATUS FOR HIGH FIDELITY WIRELESS STEREOPHONIC TRANSMISSION

(75) Inventor: Vincent Lam, Sheung Shui (HK)

(73) Assignee: RadioShack, Corp., Fort Worth, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/441,422

(22) Filed: Nov. 16, 1999

(51) Int. Cl.[7] .............................. H04H 5/00; H04B 7/00; H04B 1/04; H04B 1/16
(52) U.S. Cl. .............................. 381/2; 381/14; 455/42; 455/118; 455/209
(58) Field of Search .......................... 381/2, 4, 14, 10, 381/3, 79; 455/207, 209, 316–318, 102, 103, 118, 208, 323, 255–256, 259, 42–43, 45, 44

(56) References Cited

U.S. PATENT DOCUMENTS

| | | | |
|---|---|---|---|
| 2,515,619 A | * 7/1950 | Weyers | 381/14 |
| 2,654,806 A | * 10/1953 | Wilmotte | 381/3 |
| 3,317,838 A | * 5/1967 | Ham, Jr. | 381/3 |
| 4,612,668 A | 9/1986 | Sarac | |
| 4,710,814 A | 12/1987 | Gassmann et al. | |
| 4,829,500 A | 5/1989 | Saunders | |
| 4,829,570 A | 5/1989 | Schotz | |
| 4,845,751 A | 7/1989 | Schwab | |
| 4,876,710 A | 10/1989 | Reed et al. | |
| 4,916,532 A | 4/1990 | Streck et al. | |
| 4,933,921 A | 6/1990 | Saunders | |
| 5,023,931 A | 6/1991 | Streck et al. | |
| 5,038,402 A | 8/1991 | Robbins | |
| 5,045,948 A | 9/1991 | Streck et al. | |
| 5,047,860 A | 9/1991 | Rogalski | |
| 5,134,630 A | 7/1992 | Bateman | |
| 5,272,525 A | 12/1993 | Borchardt et al. | |
| 5,299,264 A | 3/1994 | Schotz et al. | |
| 5,349,386 A | 9/1994 | Borchardt et al. | |
| 5,373,265 A | 12/1994 | Davis et al. | |
| 5,410,735 A | * 4/1995 | Borchardt et al. | 455/423 |
| 5,446,421 A | * 8/1995 | Kechkaylo | 455/102 |
| 5,491,839 A | 2/1996 | Schotz | |
| 5,541,959 A | 7/1996 | Myers | |
| 5,548,243 A | 8/1996 | Sun et al. | |
| 5,581,576 A | * 12/1996 | Lanzetta et al. | 455/45 |
| 5,581,617 A | * 12/1996 | Schotz et al. | 381/14 |
| 5,666,658 A | 9/1997 | Borchardt et al. | |
| 5,673,323 A | * 9/1997 | Schotz et al. | 381/2 |
| 5,781,847 A | * 7/1998 | Clarke et al. | 455/69 |
| 5,822,440 A | * 10/1998 | Oltman et al. | 381/82 |
| 5,862,235 A | * 1/1999 | Kowalczyk | 381/79 |
| 5,983,078 A | * 11/1999 | Bossard | 455/102 |
| 6,100,771 A | * 8/2000 | Komiya | 455/103 |

* cited by examiner

*Primary Examiner*—Forester W. Isen
*Assistant Examiner*—Laura A. Grier
(74) *Attorney, Agent, or Firm*—Daniel R. Brown

(57) ABSTRACT

A method and apparatus for high fidelity duplexing, local transmission and reception of audio-signals transmitted from sources such as stereos, televisions, or musical instruments is taught. According to these teachings, high fidelity wireless stereophonic transmission system having a plurality of audio channels are realized. An oscillator is electrically connected to the first audio channel to provide a first carrier frequency upon which the data of the first audio channel is imposed. The first carrier frequency is then combined with a second audio channel's data forming a composite signal. The composite signal is then imposed on signal generated by a second oscillator. This second oscillator provides a carrier frequency for a frequency modulated (FM) transmitter. The signal from the FM transmitter is received by a receiver and the respective signal's of the two audio channels are demodulated and used to drive speakers.

23 Claims, 3 Drawing Sheets

Transmission System

FM Multiplex Composite Signal

New Composite Signal

Transmission System

Receiving System

METHOD AND APPARATUS FOR HIGH FIDELITY WIRELESS STEREOPHONIC TRANSMISSION

FIELD OF THE INVENTION

The present invention relates to the high fidelity duplexing, local transmission and reception of audio signals transmitted from sources such as stereos, televisions, or musical instruments.

BACKGROUND OF THE INVENTION

The present invention relates to a system for local transmission of electromagnetic signals, such as television signals, audio signals, and the like to a remote receiver. Audio and television equipment for home use is becoming increasingly complex, involving multiple programming sources capable of reproducing sound and data with ever increasing fidelity. In the past speaker assemblies have been physically connected by cables to the receiver central receiver/player. Such arrangements are unaesthetic if the speaker is not located near the receiver/player because the wires connecting the speaker to the receiver/player may be visible. Installing wires under carpet or in the walls in order to hide them can be inconvenient and expensive. Also, wires can be unsafe for use in home entertainment systems in locations not proximate to the source of the acoustic data such as outdoors.

There have been innovations in the prior art using electromagnetic transmissions with low power to send data from the receiver/player to a receiver located at a speaker. The receiver sends the data to a speaker eliminating the need for the receiver/player and speaker to be connected by wire leads. Local low power signal transmission systems usually operate within a frequency band of 902 MHz to 928 MHz using Frequency Modulated (FM) signals. The use of traditional FM signals does not adequately reproduce the quality of sound that the receiver/player is capable of transmitting, thus making the user choose between high fidelity and convenience. The present invention overcomes this deficiency in the prior art.

Traditional stereophonic FM radio was developed from its predecessor, monaural FM radio. To insure compatibility, stereo FM radio was designed to be functional with the mono-FM radio transmission systems. Traditional wireless stereophonic transmission systems employ the architecture used in FM stereo systems because the component parts are easy to obtain and because they are produced in mass quantities, and are, therefore, inexpensive.

In current transmission systems, the right and left channels are mixed for FM modulation before transmission. The modulating signal spectrum of the prior art is shown in FIG. 1. In general, the prior art comprises a pair of amplifiers forming audio processing circuitry which provides selection between one mode of undistorted amplification, one mode of odd harmonic generation, and one mode of even harmonic generation. A double sideband suppressed carrier signal is formed from the output of an oscillator and the difference between the signals in the two channels and is combined with signals from the two channels and a pilot signal. This combination is employed to modulate a voltage controlled oscillator whose center frequency is the carrier frequency. The receiver includes an amplifier which receives the signal from its associated antenna, amplifies it to the limiting input level of a demodulator, and the stereo composite signal of the demodulator is decoded by an amplifier which provides two distinct channels of audio signals capable of driving a standard stereo amplifier. Regardless of design, the FM receiver must have sufficient bandwidth to pass the range of frequencies generated by the FM transmitter, and since the receiver should be super-heterodyne, to optimize sensitivity at the frequencies to which frequency modulation is restricted, the intermediate frequency bandwidth is an important factor in the design.

In most FM frequency ranges it is not always possible to obtain optimum performance at reasonable cost with a single-conversion super-heterodyne receiver. When adjacent channel selectivity is necessary, a low intermediate frequency channel is desirable; this, however lowers the image rejection ability of the receiver. If good image rejection is desired, a high intermediate frequency channel should be used, but this is not compatible with good adjacent-channel rejection unless an expensive intermediate frequency filter is employed. In many receiver designs, the high intermediate frequency channel is chosen so that a harmonic of the mixing oscillator used for the second mixer may be used with the first mixer to reduce the number of crystals in the receiver. In other cases, a frequency synthesizer is used to generate the proper mixing frequencies.

The third requirement of the FM receiver is a limiting device to eliminate amplitude variations before they reach the frequency detector. The simplest device for converting frequency variations to amplitude variations is an "off-tune" resonant circuit. With the carrier tuned a certain amount of RF voltage will be developed across the tuned circuit, and, as the frequency is varied either side of this frequency by the modulation, the RF voltage will increase and decrease in accordance with the modulation. If the voltage across the tuned circuit is applied to an ordinary detector, the detector output will vary in accordance with the modulation, the amplitude of the variation being proportional to the deviation of the signal, and the rate being equal to the modulation frequency. Only a small portion of the resonance curve is usable for linear conversion of frequency variations into amplitude variations, since the linear portion of the curve is rather short. Any frequency variation which exceeds the linear portion will cause distortion of the recovered audio. It is also obvious that an amplitude modulation receiver is vulnerable to signals on the peak of the resonance curve and also to signals on the other side of the resonance curve.

The prior art FM signal includes the sum (R+L) and difference (R−L) of right and left audio channels in different frequency domains but complete separation of right and left audio channel is not feasible, resulting in inferior audio channels separation which deteriorates the stereo effect. Another drawback of the prior art is that the demodulation process at the receiver cannot completely eliminate the pilot tone and the residual noise of the pilot tone will distort the information in the signal. Also, the pilot signal consumes some power, decreasing the efficiency of the transmitter.

OBJECTS AND SUMMARY OF THE INVENTION

It is an object of this invention to provide a high fidelity wireless stereophonic transmission system having a plurality of audio channels, a first oscillator, a combiner electrically connected to said first oscillator and electrically connected to one of said plurality of said audio channels wherein said first oscillator provides a first carrier frequency upon which the data of said one of said audio channels is imposed forming a composite signal and a second oscillator electrically connected to said combiner wherein said second oscillator provides a second carrier frequency to said composite signal for electromagnetic transmission. It is a further object of the invention to receive the electromagnetic transmission at an antenna connected to a receiver to receive said transmitted composite signals. A mixer is electrically connected to the receiver for receiving the composite signals. A local oscillator is electrically connected to the mixer wherein the local oscillator generates an intermediate frequency signal wherein the intermediate frequency signal is sent to the mixer and mixed with the composite signal. A first demodulator is electrically connected to the mixer to receive the signal to demodulate the second carrier frequency from the composite signals and a second demodulator is electrically connected to the first demodulator to demodulate the first carrier frequency from the composite signals.

It is a further object of the present invention to provide a method of transmitting stereophonic signals by generating a first carrier frequency, combining this first carrier frequency with first data to form a composite signal, generating a second carrier frequency and combining the composite signal with said second data and multiplexing said second data and composite signal on said second carrier frequency. The second carrier frequency containing the composite signal is demodulated from the second carrier frequency from the second data. The first data is demodulated from the first carrier frequency.

It is a further object of the present invention to provide an apparatus for high fidelity wireless stereophonic transmission having a plurality of audio channels carrying data, a means for producing a first carrier frequency, a means for modulating data wherein the data of said one of said audio channel is imposed on said first carrier frequency forming a composite signal and a means for producing a second frequency electrically connected to a combiner wherein the second oscillator provides a second carrier frequency to the composite signal for electromagnetic transmission.

It is a further object of the invention to provide a means to receive the transmitted composite signals, a means for generating an intermediate frequency signal wherein the intermediate frequency signal is sent to a means for mixing the intermediate signal with the composite signal. It is a further object to provide a first means for demodulating electrically connected to the means for mixing to demodulate the second carrier frequency from the composite signals and a second means for demodulating electrically connected to the first means for demodulating to demodulate the first carrier frequency from the composite signal. It is also an object to provide a plurality of means for filtering electrically connected to said audio channel for pre-processing data in said plurality of audio channels, prior to said data entering said combiner, a means for detecting over-modulation, a transmitting means and a means for amplifying the composite signal prior to transmission through an antenna.

Other objects, advantages and capabilities of the present invention will become apparent from the following detailed description, taken in conjunction with the accompanying drawings illustrating a preferred embodiment of the invention.

DESCRIPTION OF CERTAIN EMBODIMENTS OF THE INVENTION

Figure 1:
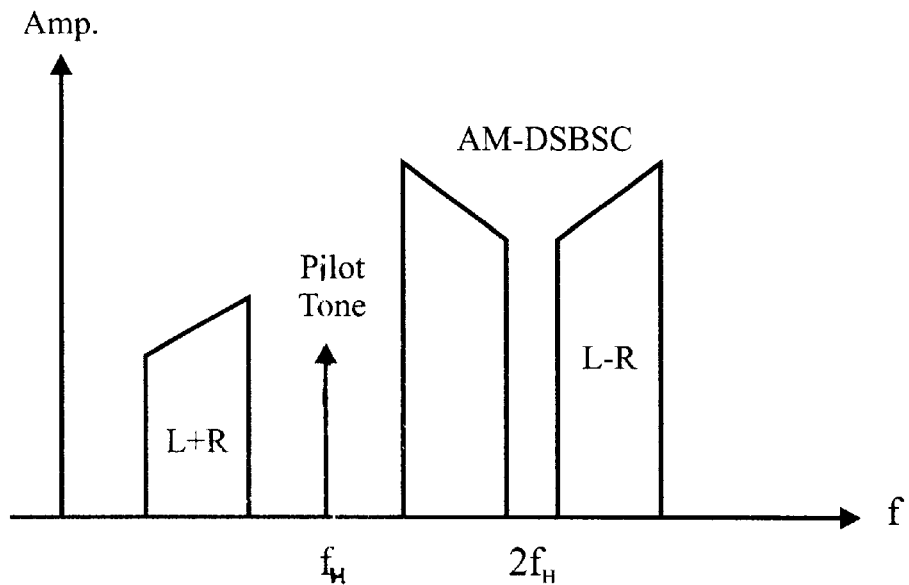
FIG. 1 is a representation of the frequency distribution of the prior art.
Figure 2:
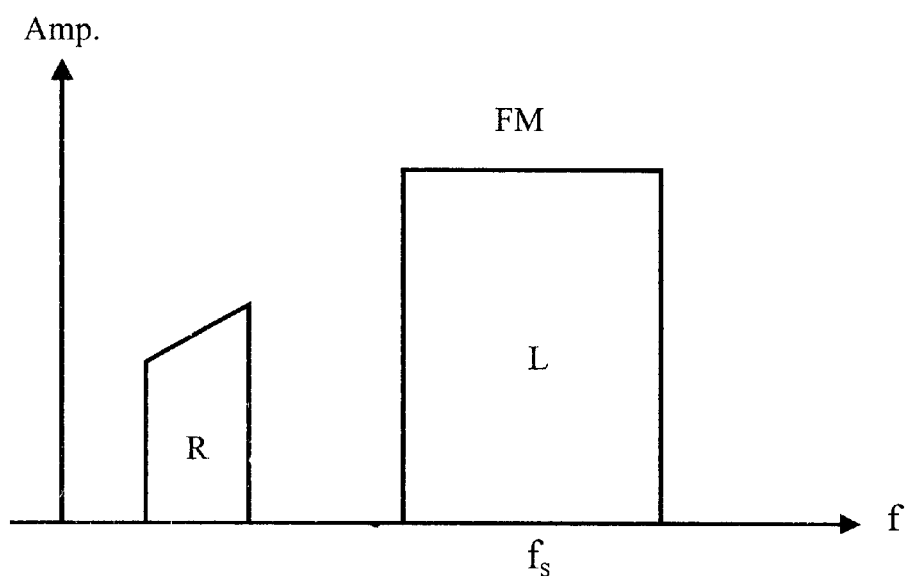
FIG. 2 is a representation of the frequency distribution of the present invention.

In order to have high fidelity, good channel separation and no pilot tone interference, the present invention forms a new composite signal. This new composite signal format is shown in FIG. 2. The right audio channel occupies, in frequency domain, from DC to a certain audible frequency limit, which for the purposes of example is depicted as 20 kHz. The left audio channel of similar frequency response will then be shifted to a new frequency band by means of a subcarrier. The subcarrier in this embodiment is in the range of 30 kHz to 80 kHz, but any frequency can be used. Since the additional left channel is FM, no pilot tone is required thus eliminating the pilot tone interference. The left audio channel is transformed to this new frequency band by frequency modulating the mentioned carrier, unlike traditional DSBSC (double side band suppressed carrier).

The high fidelity is attained because the frequency range is not restricted to only 15 kHz as ordinary FM radio. For instance, the frequency range can be set within the ordinary audible range of 20 Hz to 20 kHz. Good channel separation is attained by using dedicated right and left channels alone. Any baseband sum and difference (R+L and R−L) signal mixing is eliminated, since the present invention does not need to be compatible with FM mono-aural equipment. This new composite signal will then be modulated on a RF carrier for efficient radiation, for example in upper frequency range such as the ISM band around 900 MHz. The additional frequency shifted (R−L) channel is a DSBSC signal which is a traditionally AM (amplitude modulated) signal. AM is less susceptible to noise and is not an ideal choice to carry high quality audio wireless transmission. As a result, a novel high quality stereophonic wireless system is introduced with the merits of high channel separation, excellent frequency response and low audio hum.

Figure 3:
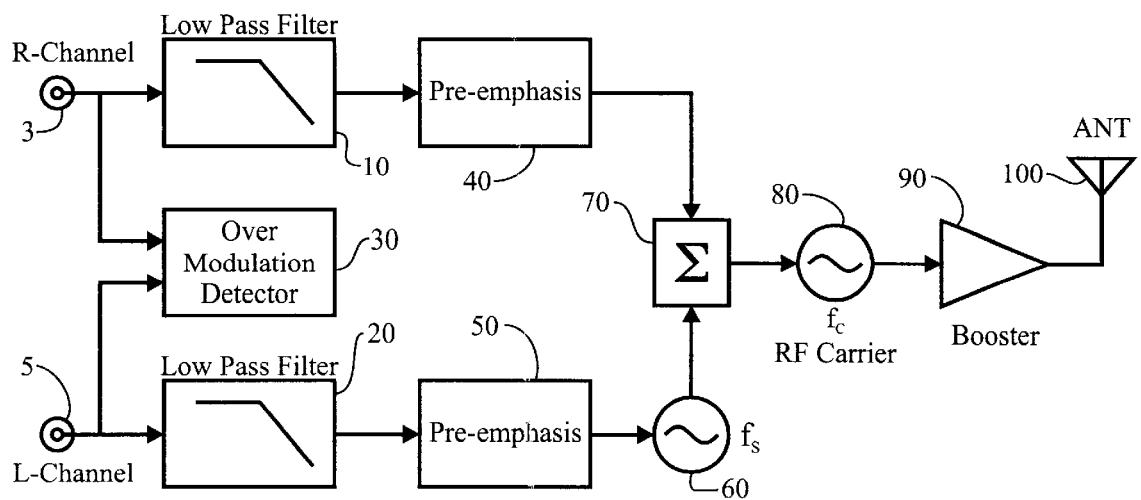
FIG. 3 is a functional block diagram of the modulation transmission portion of the present invention.

The block diagram of the present invention's transmission system is shown in FIG. 3. Both right 3 and left 5 audio channel are pre-processed by their respective low pass filters, items 10 and 20 respectively, to eliminate any non-audible interference signal. An over-modulation detector 30 is used to prompt the user on how to adjust the audio signal level to interface with the transmitter. A pre-emphasis block for each channel, 40 and 50 respectively, provide better noise immunity. The left audio channel signal is input to the FM block 60. The FM block in the preferred embodiment is a VCO (voltage controlled oscillator) with carrier frequency in the 30 k to 80 kHz range.

Once the left audio channel 5 is transformed to a higher frequency by the FM block 60, this signal is then combined with the pre-processed right audio channel 3 signal at 70. In frequency domain, these two signals occupy different frequency bands and therefore do not interfere with each other. This newly combined signal is termed the new composite signal. This composite signal is then combined at 80 on an RF carrier. This RF carrier should be very stable and therefor the preferred embodiment uses a frequency generator which is either a DRO (dielectric resonator oscillator), synthesized VCO or a crystal oscillator. The frequency modulated RF signal is then put through an amplifier and transmitted through antenna 100.

Figure 4:
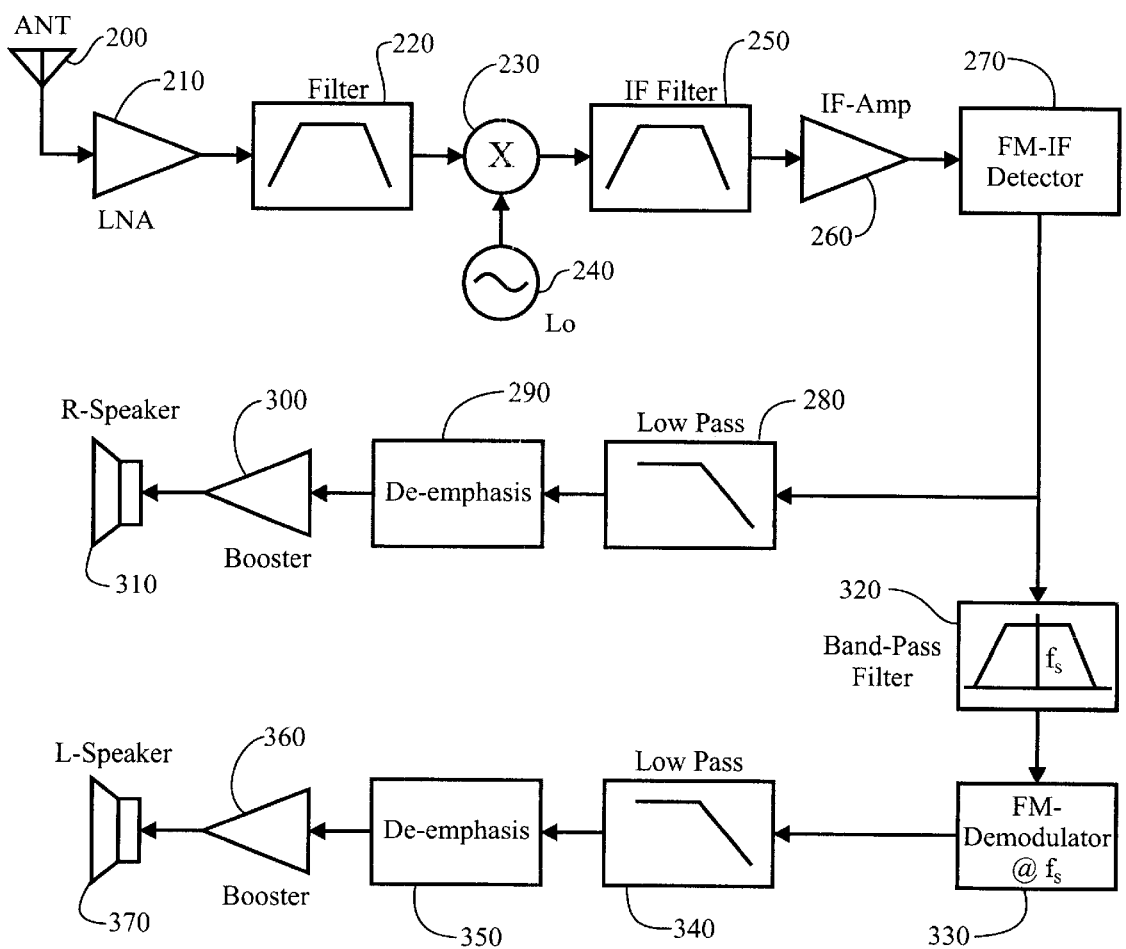
FIG. 4 is a functional block diagram of the receiver and demodulation portion of the present invention.

The basic receiving system block diagram is shown in FIG. 4. The system is a superheterodyne receiver with good spurious signal rejection such as image rejection and channel selectivity. The antenna 200 receives any signal within the desired frequency band of operation. The LNA (low noise amplifier) 210 is used to amplify the weak signal picked up by the antenna to increase the sensitivity of the receiver. RF filter 220 is used to filter out any unwanted RF signal with image rejection effect. The down-conversion process is realized by the mixer 230. A highly stable synthesized LO (local oscillator) 240 generates a signal which is mixed with the RF signal amplified by the LNA in the mixer 230 to generate the desired IF (intermediate frequency). The preferred embodiment has a system IF of 10.7 MHz.

IF filter 250 is used to improve the selectivity of the IF signal by narrowing the bandwidth of operation. IF-amp 260 increases the power of the IF signal. The FM IF detector 270, an integrated circuit, is used to demodulate the RF signal to the base band signal. This base band signal will then be of the same format of the composite signal used to modulate the RF carrier in the transmission side.

Once the composite signal is recovered by the FM detector, the right channel is discriminated out by simple low pass filter 280. This signal will then be de-emphasized at 290 to compensate the frequency response during pre-emphasis in the transmission side, and the signal is amplified up by an audio amplifier 300 before feeding this signal to the speaker 310. By using a band pass filter 320, the left channel audio frequency modulated carrier in the frequency range of 30 k to 80 kHz range can be discriminated out. This sub-carrier FM signal will then further demodulated by using Phase Lock Loop (PLL) 330 passed through a low pass filter 340, de-emphasis 350 and amplification at amplifier 360 before feeding to the speaker 370 for acoustic actualization.

By the judicious circuit design, the present invention can be employed as a compact portable high fidelity stereo transmitter capable of being attached to a musical instrument or to the instrumentalist, for example, in a pocket, to provide high fidelity stereo amplification through a radio link to a stereo amplifier without requiring direct mechanical or electrical connection between the instrument and the amplifier.

The above description of the invention is intended to be illustrative and not limiting. Various changes or modifications in the embodiments described may occur to those skilled in the art and can be made without departing from the spirit or scope of the invention.

I claim:

1. An apparatus for high fidelity wireless stereophonic transmission of audio signals not employing a carrier pilot tone as used in commercial FM broadcast systems, comprising:

a plurality of audio channels wherein said audio channels carry data within a frequency range of approximately 20 hertz to 20 kilohertz;

a first oscillator connected to receive one of said plurality of audio channels, and operable to provide a first carrier frequency of at least 30 kilohertz upon which the data of said one of said plurality of audio channels is imposed;

a combiner electrically connected to said first oscillator to receive said first carrier signal, and coupled to combine at least a second one of said plurality of audio channels with said first oscillator signal into a composite signal, wherein said first carrier and said second one of said plurality of audio channels occupy different frequency, not employing a carrier pilot tone, bands; and a second oscillator electrically connected to said combiner, and operable to provide a second carrier frequency that is combined with said composite signal to output said composite signal at said second carrier frequency for electromagnetic transmission.

2. The apparatus of claim 1 further comprising:
a plurality of low pass filters audio channel for pre-processing data in said plurality of audio channels, prior to said data entering said combiner.

3. The apparatus of claim 1 further comprising:
an antenna.

4. The apparatus of claim 3 further comprising:
a booster wherein said composite signal is amplified prior to transmission through said antenna.

5. The apparatus of claim 1 further comprising:
wherein the said first oscillator is a voltage controlled oscillator.

6. The apparatus of claim 1 further comprising:
a receiver to receive said transmitted composite signals.

7. The apparatus of claim 6 further comprising:
wherein said receiver comprises an antenna and amplifier.

8. The apparatus of claim 7 further comprising:
wherein said receiver further comprises a filter electrically connected to said amplifier.

9. The apparatus of claim 7 further comprising:
a mixer electrically connected to said amplifier for receiving said composite signals; and a local oscillator electrically connected to said mixer wherein said local oscillator generates an intermediate frequency signal wherein said intermediate frequency signal is sent to said mixer and mixed with said composite signal.

10. The apparatus of claim 9 further comprising:
a first demodulator electrically connected to the mixer to receive said signal to demodulate said second carrier frequency from said composite signals.

11. The apparatus of claim 10 further comprising:
a second demodulator electrically connected to the first demodulator to demodulate the first carrier frequency from said composite signals.

12. The apparatus of claim 11 further comprising:
an amplifier electrically connected to said second demodulator; and a speaker electrically connected to said amplifier.

13. The apparatus of claim 1 wherein said second oscillator employs a dielectric resonator oscillator for providing high frequency stability.

14. The apparatus of claim 1 wherein said second carrier frequency is combined with said composite signal in a single stage up-conversion process to output said composite signal.

15. An apparatus for high fidelity wireless stereophonic transmission of audio signals not employing a carrier pilot tone as used in commercial FM broadcast systems, comprising:

a plurality of channels wherein said channels carry data within a frequency range of approximately 20 hertz to 20 kilohertz;

a first oscillator connected to receive one of said plurality of audio channels, and operable to provide a first carrier frequency of at least 30 kilohertz upon which the data of said one of said plurality of audio channels is imposed;

a combiner electrically connected to said first oscillator to receive said first carrier signal, and coupled to combine at least a second one of said plurality of audio channels with said first oscillator signal into a composite signal, wherein said first carrier and said second one of said plurality of audio channels occupy different frequency, not employing a carrier pilot tone, bands;

a second oscillator electrically connected to said combiner, and operable to provide a second carrier frequency that is combined with said composite signal to output said composite signal at said second carrier frequency for electromagnetic transmission;

an antenna;

an RF receiver to receive said transmitted composite signals;

a mixer electrically connected to said receiver for receiving said composite signals;

a local oscillator electrically connected to said mixer wherein said local oscillator generates an intermediate frequency signal wherein said intermediate frequency signal is sent to said mixer and mixed with said composite signal;

a first demodulator electrically connected to the mixer to receive the RF signal to demodulate said second carrier frequency from said composite signals; and a second demodulator electrically connected to the first demodulator to demodulate the first carrier frequency from said composite signals.

16. A method of transmitting high fidelity stereophonic audio signals not employing a carrier pilot tone as used in commercial FM broadcast systems, comprising the steps of:

generating a first carrier frequency of at least 30 kilohertz;

combining said first carrier frequency with first data, within a frequency range of approximately 20 hertz to 20 kilohertz, to transform said first data into a composite signal;

generating a second carrier frequency not employing a carrier pilot tone; and combining said composite signal with said second data and multiplexing said second data and said composite signal on said second carrier frequency in a single stage up conversion such that said second data and said composite signal occupy different frequency bands.

17. The method of claim 16 further comprising the steps of:

receiving said second carrier frequency;

demodulating said second carrier frequency from said composite signal and said second data; and demodulating said first carrier frequency from said composite signals.

18. The method of claim 16 wherein said second carrier frequency generating step is accomplished with a dielectric resonator oscillator.

19. An apparatus for high fidelity wireless stereophonic transmission of audio signals not employing a carrier pilot tone as used in commercial FM broadcast systems, comprising:

a plurality of audio channels wherein said audio channels carry data within a frequency range of approximately 20 hertz to 20 kilohertz;

a means for producing a first carrier frequency of at least 30 kilohertz connected to receive one of said plurality of audio channels, and operable to provide a first carrier frequency upon which the data of said one of said plurality of audio channels is imposed;

a means for modulating data from one of said plurality of audio channels on said carrier frequency electrically connected to said means for producing a first carrier frequency to receive said first carrier signal, and coupled to combine at least a second one of said plurality of audio channels with said first carrier signal into a composite signal, wherein said first carrier and said second one of said plurality of audio channels occupy different frequency, not employing a carrier pilot tone, bands; and a means for producing a second oscillator signal electrically connected to said means for modulating, and operable to provide a second carrier frequency that is combined with said composite signal to output said composite signal at said second carrier frequency for electromagnetic transmission.

20. The apparatus of claim 19 further comprising:

a means to receive said transmitted composite signals;

a means for generating an intermediate frequency signal wherein said intermediate frequency signal is sent to a means for mixing said intermediate signal with said composite signal;

a first means for demodulating electrically connected to said means for mixing to demodulate said second carrier frequency from said composite signals; and a second means for demodulating electrically connected to said first means for demodulating to demodulate the first carrier frequency from said composite signal.

a plurality of means for filtering electrically connected to said audio channel for pre-processing data in said plurality of audio channels, prior to said data entering said combiner.

21. The apparatus of claim 20 further comprising:

a transmitting means; and a means for amplifying said composite signal prior to transmission through an antenna.

22. The apparatus of claim 21 further comprising:

a means to detect over-modulation;

a means for applying a pre-emphasis block for each channel;

a means for low noise amplification electrically attached to said means for receiving to amplify the signal picked up by a receiving antenna to increase the sensitivity of the receiver;

a means for generating a local oscillation signal which is mixed with the signal amplified by the means for low noise amplification in the mixer; and means for low pass filtering to discriminate audio frequencies.

23. The apparatus of claim 19 further comprising:

a means for detecting over-modulation.

* * * * *